United States Patent [19]
Brown

[11] Patent Number: 6,028,811
[45] Date of Patent: Feb. 22, 2000

[54] ARCHITECTURE FOR HIGH BANDWIDTH WIDE I/O MEMORY DEVICES

[75] Inventor: Brian L. Brown, Sugar Land, Tex.

[73] Assignee: Texas Instruments Incorporated, Dallas, Tex.

[21] Appl. No.: 09/219,174

[22] Filed: Dec. 22, 1998

Related U.S. Application Data

[60] Provisional application No. 60/070,442, Jan. 5, 1998.

[51] Int. Cl.$^7$ .................................................. G11C 8/00
[52] U.S. Cl. ........................ 365/230.03; 365/230.06; 365/230.04
[58] Field of Search .................. 365/230.03, 230.06, 365/230.04, 238.5

[56] References Cited

U.S. PATENT DOCUMENTS

| | | | |
|---|---|---|---|
| 5,594,704 | 1/1997 | Konishi et al. | 365/230.03 |
| 5,617,555 | 4/1997 | Patel et al. | 365/230.03 |
| 5,928,373 | 7/1999 | Yoo | 714/719 |

Primary Examiner—David Nelms
Assistant Examiner—Tuan T. Nguyen
Attorney, Agent, or Firm—Robby T. Holland; Carlton H. Hoel; Richard L. Donaldson

[57] ABSTRACT

A random access memory (RAM) (700) is disclosed which includes a reduced page size for decreasing power consumption, and a unique input/output (I/O) arrangement for maintaining a relatively large I/O space, without substantially increasing the number of I/O lines within the RAM. The RAM (700) includes a number banks (704) each of which is logically divided into even array sections and odd array sections (900). Data from the array sections (900) is coupled to I/O select blocks (914, 916, 918, 920) by groups of local I/O lines (902, 904, 906, 908). According to an applied address, the sense amplifiers within the even array sections are activated, indicating an "even" sense cycle, or the sense amplifiers within the odd array sections are activated, indicating an "odd" sense cycle. In an even sense cycle, the I/O select blocks (914, 916, 918, 920) couple the LIO line groups of the even array sections (900) to global I/O lines (910, 912). In an odd sense cycle, the I/O select blocks (914, 916, 918, 920) couple the LIO lines groups of the odd array sections (900) to global I/O lines (910, 912).

23 Claims, 9 Drawing Sheets

ARCHITECTURE FOR HIGH BANDWIDTH WIDE I/O MEMORY DEVICES

This application claims benefit of provisional application Ser. No. 60/070,442 filed Jan 5, 1998.

TECHNICAL FIELD

The present invention relates generally to semiconductor memory devices, and more particularly to semiconductor memory device architectures for accessing data within a memory device.

BACKGROUND OF THE INVENTION

A common type of semiconductor memory device is the random access memory (RAM). RAMs include many data storage locations each having a particular address. To read data from the RAM, an address is applied to the RAM in conjunction with a read command and stored data is provided at input/output (I/O) pins. To write data into a RAM, an address is applied to the RAM in conjunction with a write command, and at the same time, data is applied to the I/O pins. The applied data is then stored at the location corresponding to the applied address. The process of selecting a storage location in response to an applied address, is referred to as decoding, and the various bits of the applied address must be decoded by logic circuits to arrive at the correct data location.

Among the many important performance features of a RAM device is the amount of power the device consumes. Reduction in RAM power consumption has been a consistent and important goal in RAM design. Power consumption can be a critical aspect of device performance in portable applications having finite power supplies, such as re-chargeable batteries. Thus, any modifications to RAMs that can reduce power consumption are valuable advances in the art. This is reflected by the fact that RAMs having lower power requirements can often command higher prices in the marketplace.

While low power consumption is desirable, the physical size of a RAM is also a very important feature in a RAM design. Because RAMs are typically semiconductor devices manufactured on semiconductor wafers, the smaller the size of the RAM, the larger the number of devices which can be fit on the wafer. Thus, a smaller device size allows more products to be created with same starting material, this can reduce the overall manufacturing cost of a RAM. Conversely, larger RAM sizes are less cost effective. The size of semiconductor memory devices is usually discussed in terms of its "die" size. Thus, any RAM features which results in increases in the die size of a RAM are undesirable.

A common circuit element in a semiconductor RAM is the sense amplifier. Sense amplifiers "sense" the logic stored within a memory cell by amplifying the relatively small data signals provided by the memory cells. Some RAM devices, dynamic RAMs (DRAMs) in particular, also use sense amplifiers to refresh memory cell data. Thus, in a read operation of a DRAM, even though entire banks of sense amplifiers are activated, output data will be read from only a portion of the activated sense amplifiers. The number of sense amplifier banks that are activated by a RAM in a read operation is sometimes referred to as the "page" size of RAM. It follows that RAMs having large page sizes will consume more power, as they will activate a larger number of sense amplifiers.

The overall functional arrangement of a RAM is often described in terms of the RAM's architecture. The RAM architecture often includes those functional elements required for reading data from, and writing data into the RAM. The physical depiction of a RAM architecture can often mimic the actual physical appearance of the manufactured semiconductor device, because circuit blocks and conductive lines are drawn in the same relationship to one another, as they will physically appear on the manufactured device.

Figure 1:
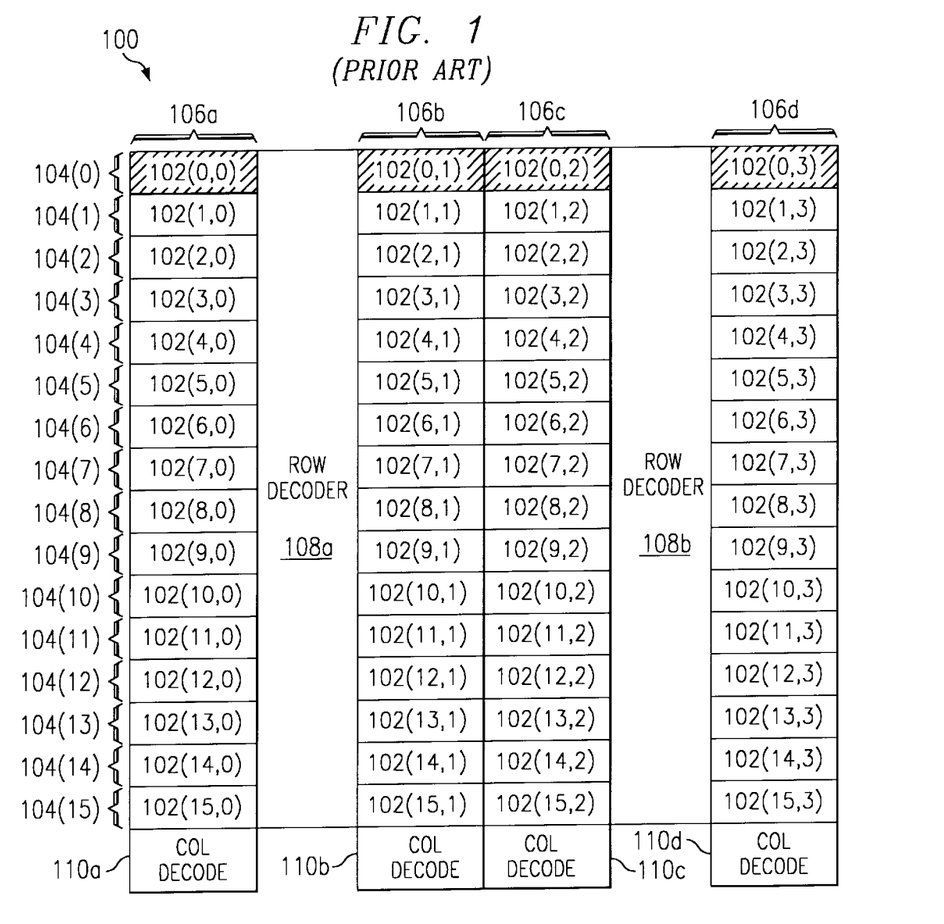
FIG. 1 is a block diagram illustrating the architecture of a prior art large page size random access memory (RAM).

Referring now to FIG. 1, a block diagram is set forth generally illustrating a random access memory (RAM) architecture of the prior art. The RAM is a 64-megabit RAM having a 128-bit I/O space. The RAM is designated by the general reference character 100 and represents a RAM having a large page size. The RAM 100 is shown to include a number of array blocks, each designated by the general reference character 102. Each array block is further identified by two numbers contained within parentheses, which generally identify the array bank's position within the RAM 100. The first number represents a bank, the second number represents a quadrant. Thus, array block 102(0,0) is in bank number zero and quadrant number zero.

The RAM 100 of FIG. 1 is shown to include sixteen banks, shown as 104(0) to 104(15), each including four array blocks 102. In addition, the RAM 100 can be further conceptualized as being divided into four quadrants. Each quadrant includes one quarter of the array banks, when viewed in the column direction. Thus, array blocks 102(0,0), 102(1,0), 102(2,0) . . . 102(15,0) form the first quadrant, shown as 106a. The remaining three quadrants are shown as 106b to 106d. Each array block (102(0,0)–102(15,3)) includes memory cells that are accessed by row decoder blocks and column decoder blocks. In the architecture of FIG. 1, a first block of row decoders 108a are shown to be coupled to the first quadrant 106a and the second quadrant 106b, and a second block of row decoders 108b is shown coupled to the third quadrant 1106c and the fourth quadrant 106d. The RAM 100 further includes four column decoder blocks, 110a to 110d, each associated with one quadrant 106a to 106d.

Figure 2:
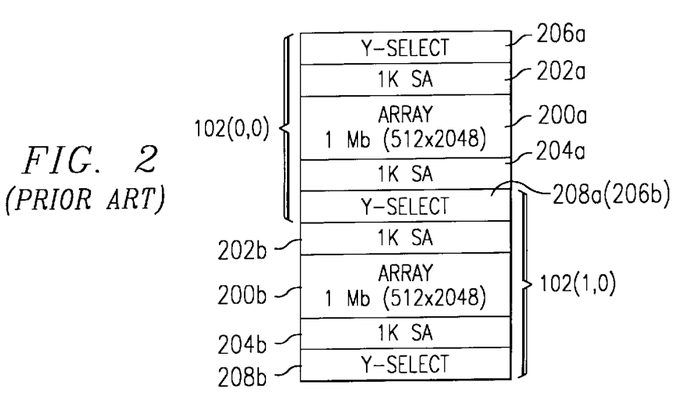
FIG. 2 is a block diagram illustrating the arrangement of array blocks within the prior art RAM of FIG. 1.

Two array blocks (102(0,0) and 102(1,0)) from the architecture of FIG. 1 are set forth in more detail in FIG. 2. Each array block (102(0,0) and 102(1,0)) includes the same general elements. Accordingly, like elements will be referred to by the same reference character, with the elements of array block 102(0,0) ending with the letter "a," and the elements of array block 102(1,0) ending with the letter "b." Each array block 102(0,0) and 102(1,0) includes a memory cell array (200a, 200b), a top bank of sense amplifiers (202a and 202b), a bottom bank of sense amplifiers (204a and 204b), a top Y-select circuit (206a and 206b), and a bottom Y-select circuit (208a and 208b). It is noted that the bottom Y-select circuit 208a of array bank 102(0,0) is the same as the top Y-select circuit 206a of array bank 102(1,0).

The memory cell arrays (200a, 200b) each have a 1 megabit (1 Mb), or 1,048,576 bit storage capacity. Thus, each memory cell array includes 1,048,576 memory cells. The memory cells are accessed by 2048 (2 k) pairs of bit lines and 512 word lines. The top bank of sense amplifiers (202a and 202b) includes 1024 ("1 k") sense amplifiers for amplifying data signals on half of the bit line pairs in its respective memory array. The bottom bank of sense amplifiers (204a and 204b) also includes 1 k sense amplifiers, and amplifies data signals on the other half of bit lines in its respective memory array. The top Y-select circuits (206a and 206b) and bottom Y-select circuits (208a and 208b) receive Y-select signals from the column decoder 110a, and in response thereto, couple selected bit lines to I/O lines.

Figure 3:
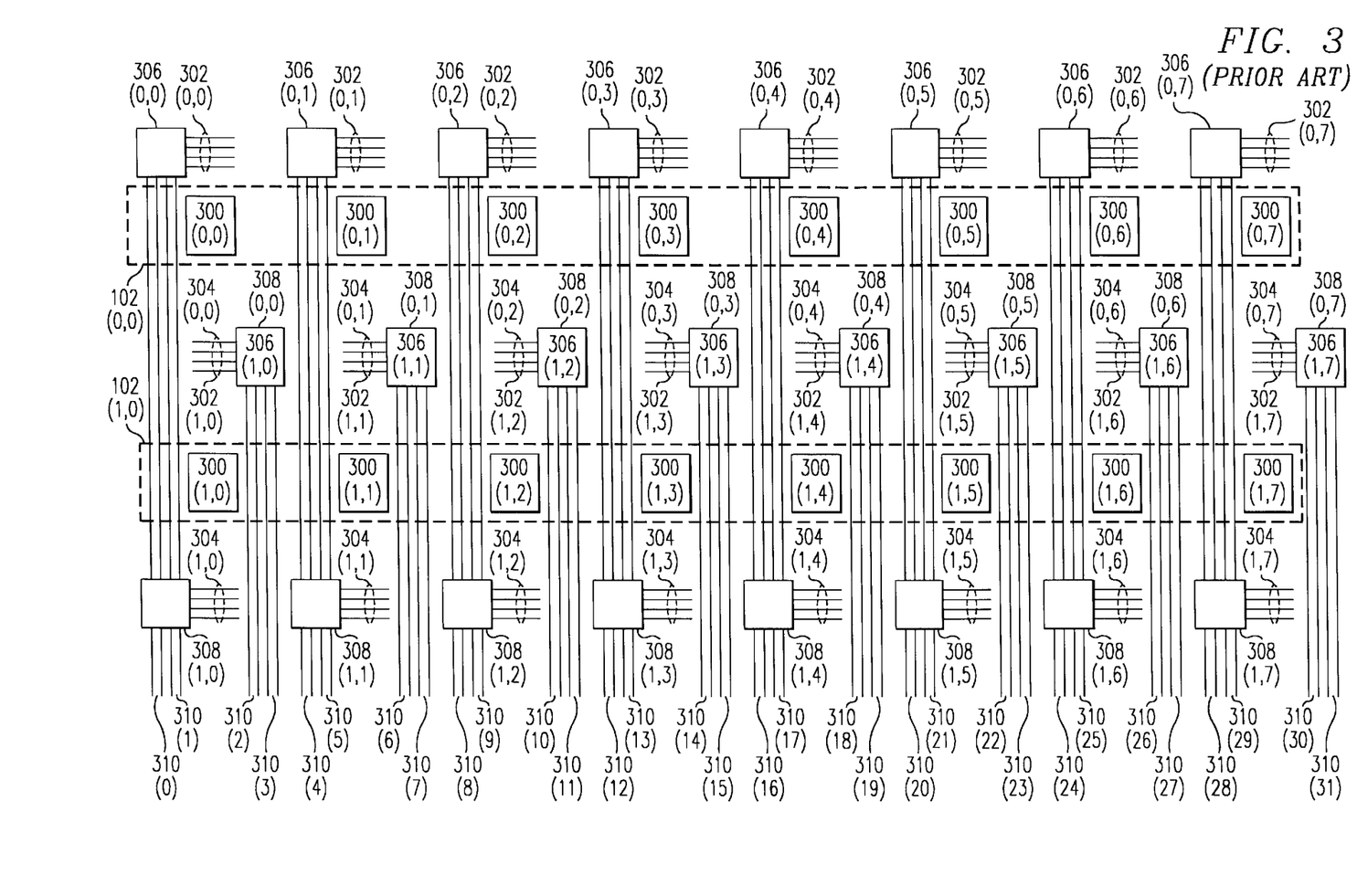
FIG. 3 is a block diagram illustrating the input/output (I/O) arrangement of the prior art RAM set forth in FIG. 1.

The I/O line arrangement for array blocks (102(0,0) and 102(1,0)) is set forth in FIG. 3. FIG. 3 illustrates essentially one eighth of memory quadrant 106a. When viewed with respect to the I/O lines, each array block is logically divided into eight array sections, shown as 300(i,j), where i represents the bank in which the array section is located, and j represents the position of the array section within the array block (102(0,0) and 102(1,0)). In the architecture of FIGS. 1–3, each array block (102(0,0) and 102(1,0)) is divided into eight array sections. Therefore, each array section (300(0,0) to 300(1,7)) includes 256 bit line pairs. coupled to 128 sense amplifiers of a top bank (202a and 202b) and 128 sense amplifiers of a bottom bank (204a and 204b). In addition, each array section (300(0,0) to 300(1,7)) includes a portion of the top Y-select circuits (206a and 206b) and bottom Y-select circuits (208a and 208b).

The I/O line arrangement is shown in FIG. 3 includes two top local I/O (LIO) line pairs, and two bottom local I/O line pairs associated with each array section (300(0,0) to 300(1, 7)). The top LIO pairs are designated by the reference characters 302(i,j) and the bottom LIO pairs are designated by the reference characters 304(i,j). For example, array section 300(0,0) has an associated two top LIO pairs 302 (0,0) and an associated two bottom LIO line pairs 304(0,0). In a similar manner to the Y-select circuits in FIG. 2, the bottom LIO line pairs for one array section serve as the top LIO line pairs for the array section below. For example, the bottom LIO lines 304(0,0) for array section 300(0,0) are the same as the top LIO lines 302(1,0) for array section 300(1, 0).

The LIO lines are coupled to global I/O lines (GIO) by I/O select blocks. The I/O select blocks include a top I/O select block 306(i,j) and bottom I/O select block 308(i,j). As in the case of the top and bottom LIO lines, the bottom I/O select blocks (308(0,0) to 308(0,7)) for the array block 102(0,0), serve as the top I/O select blocks (306(1,0) to 306(1,7)) for the array block 102(1,0). The GIO lines are grouped into pairs, and are shown as items 310(0) to 310(31). The I/O select blocks of a given array block are activated at the same time as the sense amplifier banks of that array block. For example, in the case of FIG. 3, when the sense amplifiers of array block 102(0,0) are enabled, upper I/O blocks 306(0,0) to 306(0,7) and lower I/O blocks 308(0,0) to 308(0,7) are also enabled. In contrast, when the sense amplifiers of array block 102(1,0) are enabled, upper I/O blocks 306(1,0) to 306(1,7) (which are the same as lower I/O blocks 308(0,0) to 308(0,7)) and lower I/O blocks 308(1,0) to 308(1,7) are enabled.

The same general I/O configuration set forth in FIG. 3 is repeated throughout the RAM 100 shown in FIG. 1, resulting in 32 GIO pairs being provided per quadrant, for a total I/O space of 128 bits.

Figure 4A:
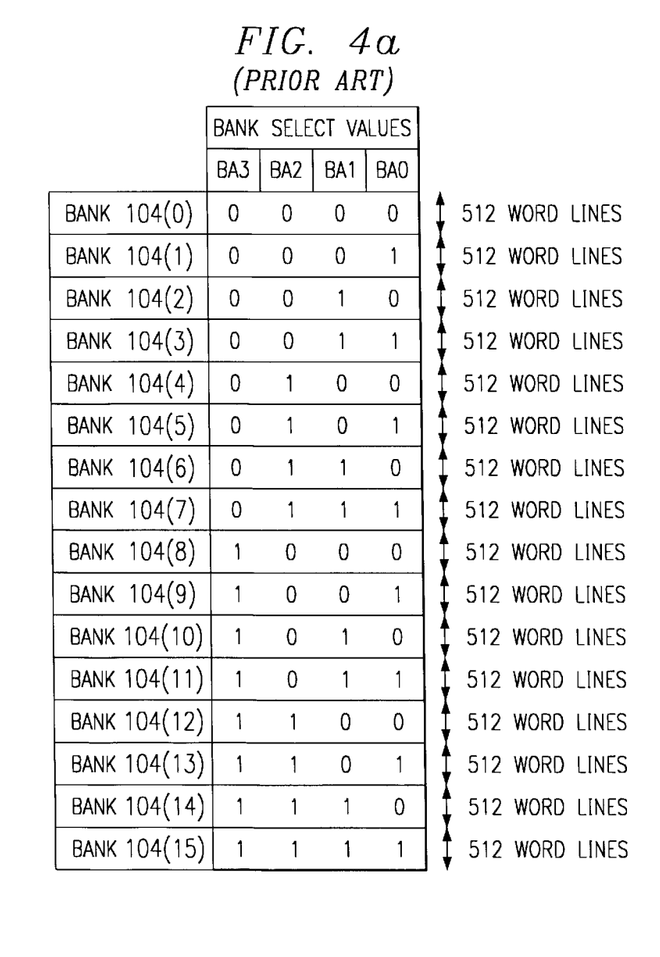
FIG. 4a is a table illustrating the bank and row decoding arrangement of the prior art RAM of FIG. 1.
Figure 4B:
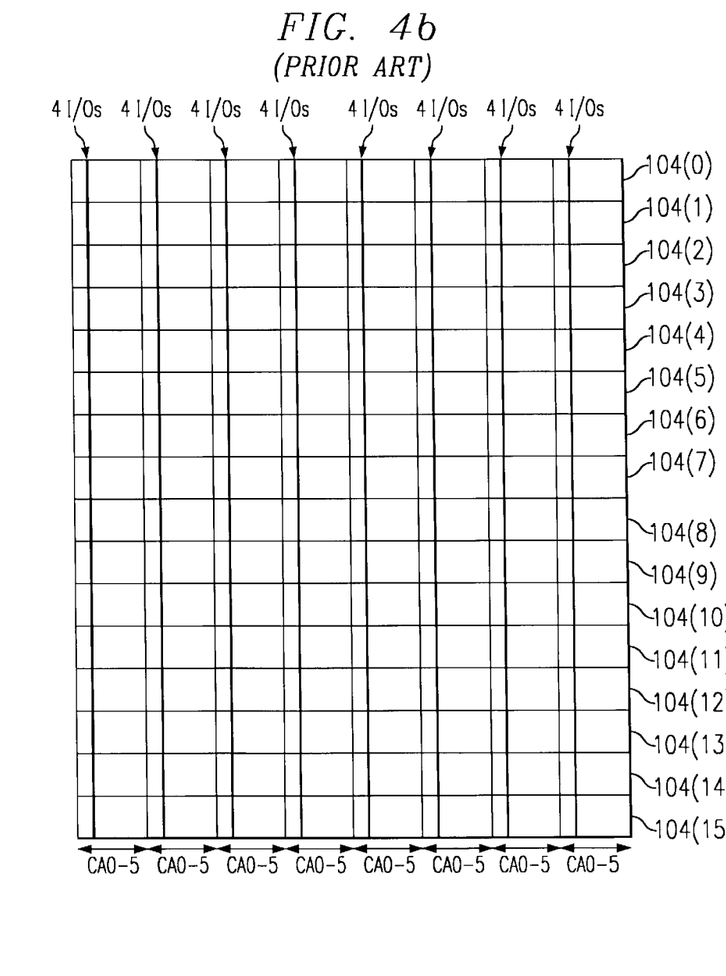
FIG. 4b illustrates the column decoding arrangement of the prior art RAM of FIG. 1.

Data locations within the RAM 100 are accessed via the GIO pairs, by selecting one of the banks (104(0) to 104(15)), and applying a column address and a row address. In this manner, the bank select information, column address, and row address are decoded by the RAM 100 to access one of the 512k 128-bit locations within the RAM 100. The decoding arrangement of the RAM 100 is illustrated in FIGS. 4a and 4b. FIG. 4a is a table setting forth the bank select decoding scheme and row decoding scheme. The RAM 100 receives bank select decode information in the form of four bank select bits, shown as BA0–BA3. A bank (104(0) to 104(15)) is selected according to the various combinations of the possible BA0–BA3 values. The BA0–BA3 values may be derived from a portion of an applied address. The 512 rows within each bank (104(0) to 104(15)), are selected by a row address which includes row address bits RA0–RA8. Thus, the application of bank select information (BA0–BA3) and row address information (RA0–RA8) results in the selection of one of the word lines within the RAM 100.

The selection of columns within the RAM 100 is illustrated in FIG. 4b. FIG. 4b sets forth the column selection arrangement for one quadrant 106a of the RAM 100. The 2k columns of the quadrant 106a are logically divided into eight groups of 256 columns each. Four columns are selected from the 256 of each group by the application of column address bits, shown as CA0–CA5. In response to the application of the CA0–CA5 values, one Y-select signal within each 256 column group will be activated, and select four columns to place data on four local I/Os. In this manner, the application of the column address information (CA0–CA5) selects 32 columns in each quadrant (106a–106d) to provide the 128 bit I/O space.

If reference is made to FIG. 4b in conjunction with FIG. 3, it is noted that the application of each particular CA0–CA5 combination, results in the activation of one of sixty-four Y-select signals coupled to each array section (300(0,0) to 300(1,7)). In response to each different Y-select signal, the portions of the upper and lower Y-select circuits within each array section (300(0,0) to 300(1,7)) couple data to the upper and lower LIO lines (302 and 304) of the array section. In other words, each Y-select signal, selects four data bits from an array section.

Referring back to FIG. 1, it is noted that array blocks 102(0,0) to 102(0,3) are hatched. This indicates that the sense amplifiers within the array blocks (102(0,0) to 102(0, 3)) are active. The RAM 100 is considered to be a "large" page size RAM because, in a read operation, the sense amplifier banks for all the array blocks within a bank are activated at the same time.

Figure 5:
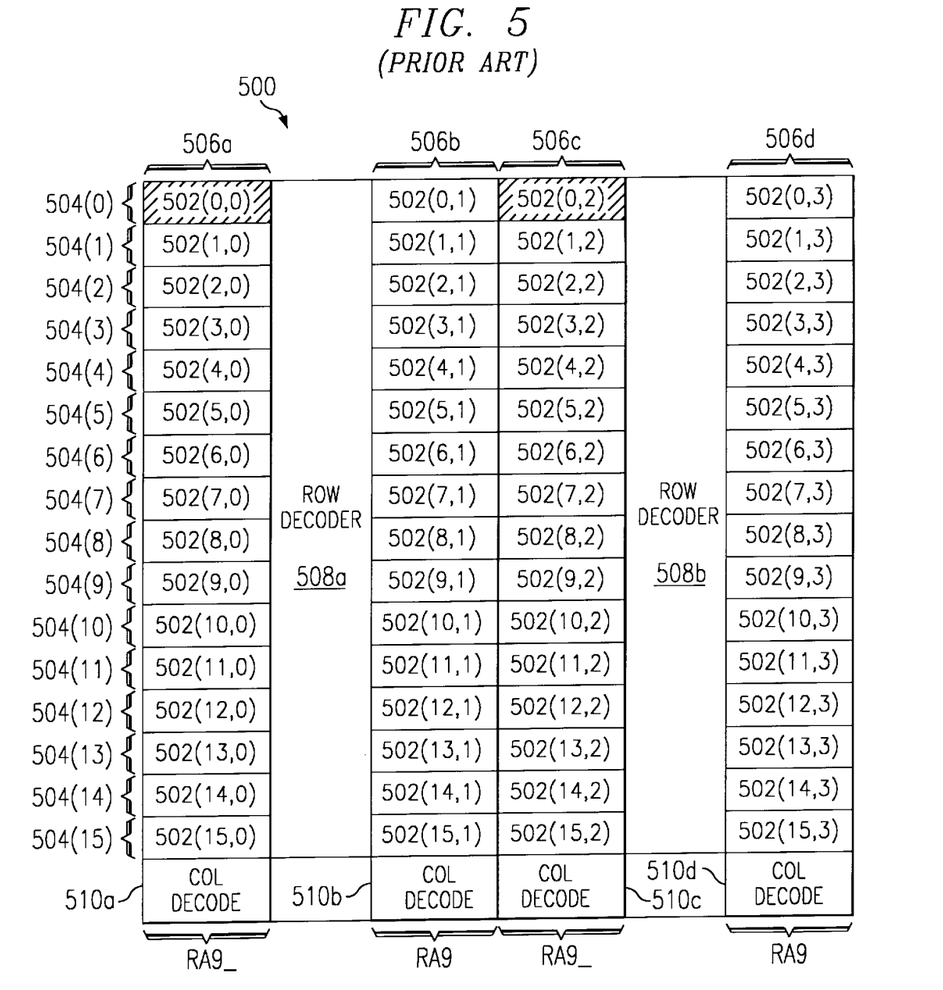
FIG. 5 is a block diagram illustrating a reduced page size RAM of the prior art.

As previously noted, the activation of sense amplifiers can consume considerable power in a RAM 100. One approach to reducing the amount of power consumed by a RAM is to decrease the page size of the RAM. This reduces the number of sense amplifiers that are active in a read cycle. FIG. 5 illustrates one example of a reduced page size RAM approach. Unlike the RAM of FIG. 1, which is logically divided into 512 rows and 64 columns per bank, the architecture of FIG. 5 illustrates a RAM that is logically divided into 1k rows and 32 columns per bank. The reduced page size RAM is designated by the general reference character 500 and includes many of the same elements as the RAM 100 of FIG. 1. To that extent, like elements will be referred to by the same reference character, except that the elements of FIG. 5 will begin with the number "5" instead of the number "1."

The reduced page size RAM 500 has the same general configuration as the RAM 100 of FIG. 1, including array blocks (502(0,0) to 502(15,3)) arranged into sixteen banks (504(0) to 504(15)) and four quadrants (506a to 506d). In addition, two row decoder blocks (508a and 508b) are situated between the quadrants (506a–506d), and a column decoder block (510a–510d) is associated with each quadrant (506a–506d).

The decoding arrangement of the reduced page size RAM 500 is similar to that of the RAM 100 set forth in FIG. 1. Bank select information results in the selection of one of the banks (504(0) to 504(15)), and a row address results in the activation of one of the 512 word lines within the selected bank.

The reduced page size RAM 500 differs from that of FIG. 1, in that an extra level of decoding is utilized to activate the sense amplifiers of two array blocks from within the selected bank, instead of all four array blocks of the bank. The extra level of decoding is accomplished by another row address bit, RA9. The value of RA9 row address bit dictates which array blocks are activated. For example, as set forth in FIG. 5, when the RA9 bit is low, array blocks are selected from quadrants 506a and 506c. When the RA9 bit is high, array blocks from quadrants 506b and 506d are selected. In FIG. 5, two array blocks (502(0,0) and 502(0,2)) are emphasized by hatching to illustrate this principle. In this case, the bank select information results in the selection of bank 504(0), and the row address results in the selection of word lines and the activation of the sense amplifier banks within array blocks (502(0,0) and 502(0,2)). In this manner, 4k sense amplifiers are enabled in a read operation in the reduced page size RAM 500, in contrast to the 8k sense amplifiers in the case of the RAM 100 of FIG. 1.

A drawback to the reduced page size RAM 500 arises out the desire to maintain a 128 bit I/O space for such a device. It will be recalled that the I/O arrangement of the RAM 100 provided 32 GIO pairs for each quadrant. Because an array bank is activated in all four quadrants in any given read operation, the RAM of FIG. 1 provides access to 128 data locations. In contrast, in the reduced page size RAM 500 array banks in only two of the four quadrants are activated in any given read operation. Thus, the same I/O arrangement of FIG. 3 (i.e., 32 bits per array bank) will not suffice for the reduced page size RAM 500, as only 64 data locations could be accessed. Thus, the I/O arrangement of the RAM 500 of FIG. 5 is modified over that of FIG. 3, to provide 64 GIO pairs for each quadrant, and thereby maintain a 128-bit I/O space.

Figure 6:
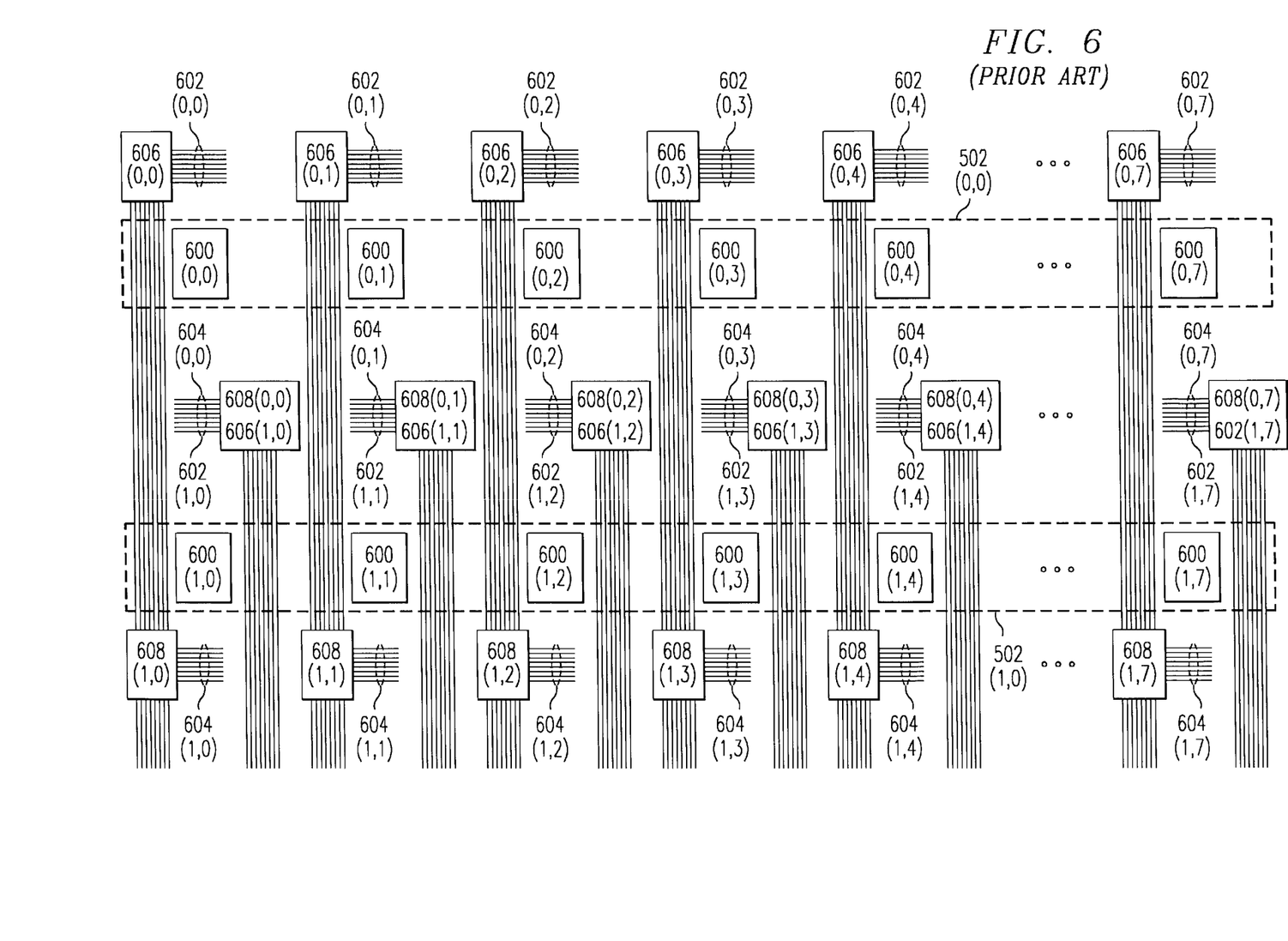
FIG. 6 is a block diagram illustrating the I/O arrangement of the prior art reduced page size RAM of FIG. 5.

FIG. 6 illustrates the modified I/O arrangement which provide 64 GIO pairs for each quadrant (506a–506d) in the reduced page size RAM 500. FIG. 6 sets forth the I/O line arrangement for array blocks (502(0,0) and 502(1,0)). The modified I/O arrangement has the same general configuration as that set forth in FIG. 3. Essentially one eighth of memory quadrant 506a is shown, with the array blocks (502(0,0) and 502(1,0)) being logically divided into eight array sections (600(0,0) to 600(1,7)). Each array section (600(0,0) to 600(1,7)) includes 256 bit line pairs, coupled to 128 sense amplifiers of a top sense amplifier bank, and 128 sense amplifiers of a bottom sense amplifier bank. In addition, each array section (600(0,0) to 600(1,7)) also includes a portion of a top Y-select circuit and a portion of a bottom Y-select circuit.

The I/O line arrangement of the reduced page size RAM 500 differs from that set forth in FIG. 3, in that four top LIO pairs (602(0,0) to 602(0,7)) and four bottom LIO pairs (604(0,0) to 604(1,7)) (as opposed to two top and bottom LIO line pairs) are associated with each array section (600(0,0) to 600(1,7)). The bottom LIO line pairs for one array section serve as the top LIO line pairs for the array section below. The groups of four LIO line pairs are coupled to groups of four global I/O line pairs (GIO) by top I/O select blocks (606(0,0) to 606(1,7)), and bottom I/O select blocks (608(0,0) to 608(1,7)).

It follows that in case of I/O arrangement of FIG. 6, each array section (500(0,0) to 500(1,7)) receives 64 Y-select lines. But in contrast to the large page size I/O arrangement of FIG. 3, in the reduced page size I/O arrangement of FIG. 6, an active Y-select line selects eight data bits instead of four.

The drawback to the reduced page size I/O arrangement of FIG. 6 is that it results in an increased die size. The four LIO line pairs must be repeated in each bank (504(0) to 504(15)), which can increase the size of the RAM 500 in the word line direction. In the same fashion, the four GIO line pairs must be repeated within each array bank (502(0,0) to 502(15,3)), which can increase the size of the RAM 500 in the bit line direction.

It would be desirable to provide a reduced page size RAM that does not suffer from the increased die size penalty required for increasing the number of I/O lines over larger page size RAMs.

SUMMARY OF THE INVENTION

According to the preferred embodiment, a random access memory (RAM) includes a plurality of banks, each bank including a number of array blocks. Each array block is logically divided into even array sections and odd array sections. Each array section includes bit lines, sense amplifiers, and a Y-select circuit. In a given read operation, one of the banks is accessed, and either the sense amplifiers within the even array sections or the sense amplifiers within the odd array sections will be activated. The RAM further includes a unique input/output (I/O) arrangement having global I/O lines that are shared between even and odd array sections. When the sense amplifiers of the even array sections are activated, data from the bit lines within are coupled to the shared global I/O lines. When the sense amplifiers of the odd I/O sections are activated, data from the bit lines within are coupled to the shared global I/O lines. By activating only half of the sense amplifiers during a read operation, less power is consumed. At the same time, the unique I/O arrangement provides relatively large I/O space without significant increases in die size.

DETAILED DESCRIPTION OF THE EMBODIMENTS

The preferred embodiment is a reduced page size random access memory (RAM) that provides large number of I/Os without significantly increasing the die size of the RAM, by increasing the number of input/output (I/O) lines within the device. The preferred embodiment is a 64 megabit (67,108,864 bit) RAM having a 128 bit I/O space. A reduced page size is achieved by activating alternating sections of sense amplifiers within a sense amplifier block, rather than an entire sense amplifier block.

Figure 7:
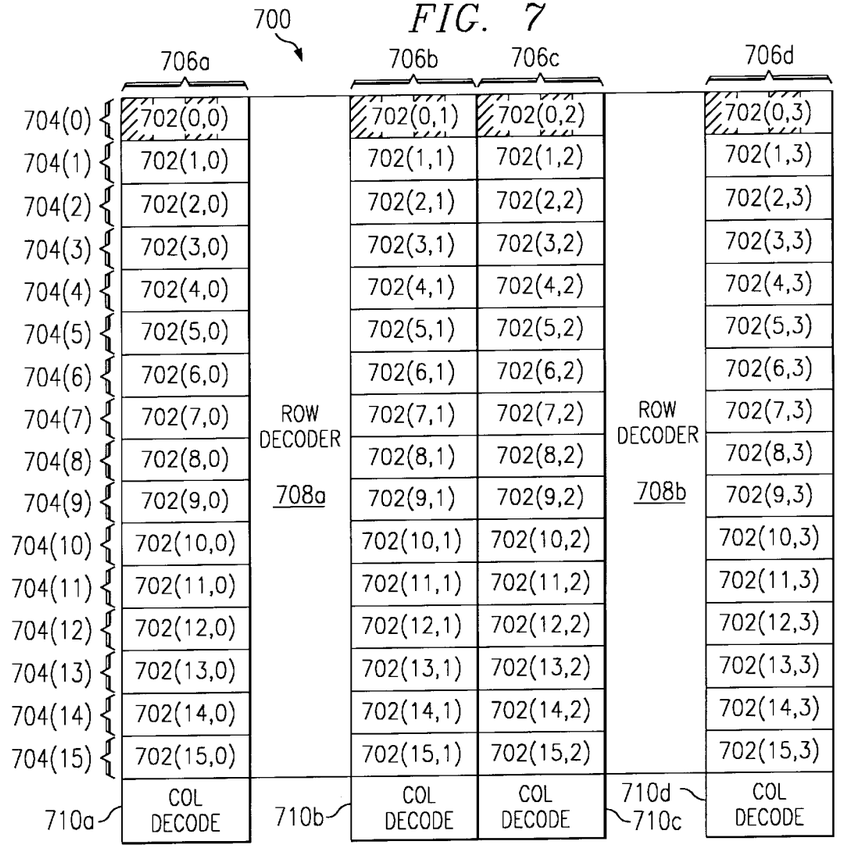
FIG. 7 is a block diagram of a reduced page size RAM according to the preferred embodiment.

Referring now to FIG. 7, a block diagram is set forth generally illustrating the reduced page size RAM according to the preferred embodiment. The reduced page size RAM is designated by the general reference character 700, and shown to include a number of array blocks, each designated by the general reference character 702. The array blocks are arranged in the vertical direction into 16 banks, shown as 704(0) to 704(15), and in the horizontal direction into four quadrants, shown as 706a–706d. In addition to being designated by the reference character 702, each array block is further identified by numbers in parentheses, identifying the array block's bank and quadrant. Therefore, 64 array blocks are illustrated in total, shown as 702(0,0) to 702(15,3).

In the preferred embodiment, each array block (702(0,0) to 702(15,3)) includes one megabit (1 Mb), or 1,048,576 memory cells arranged in rows and columns. Memory cells within the same row are accessed by word lines, while memory cells within the same column are accessed by bit lines. Word lines are selected by row decoder blocks (708a and 708b) disposed between quadrants 706a and 706b, and between quadrants 706c and 706d, respectively. Bit lines within the array blocks (702(0,0) to 702(15,3)) are accessed according to Y-select signals generated by column decoder blocks (710a–710d), each associated with one of the quadrants (706a–706d) (i.e., column decoder block 710a provide column select signals for the bits lines in quadrant 706a, column decoder 710b provide column select signals for bit lines within quadrant 706b, etc.).

In FIG. 7, portions of the array block (702(0,0) to 702(0,3)) within bank 704(0) are emphasized by hatching, to represent the activation of sense amplifiers within each array block. By activating alternating sets of sense amplifiers, the preferred embodiment provides a reduced page size, and hence consumes less power.

Figure 8:
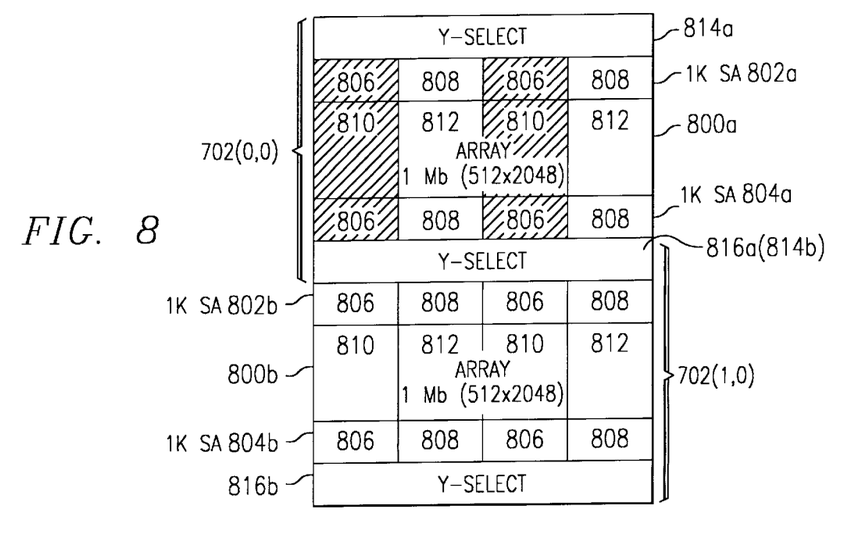
FIG. 8 is a block diagram illustrating the arrangement of array blocks according to the preferred embodiment.

The sense amplifier activation arrangement of the preferred embodiment is shown in more detail in FIG. 8. FIG. 8 is a detailed block diagram illustrating array blocks 702(0,0) and 702(1,0) of FIG. 7. Because the array blocks each include the same general structures, like structures are identified by the same reference characters, with the structures of array block 702(0,0) ending with the letter "a," and the structures of elements of array block 702(1.0) ending with the letter "b." Each array block (702(0,0) and 702(1,0)) includes a memory cell array 800, having 2048 (2k) pairs of bit lines, and 512 word lines. Half of the bit lines pairs (1k) are coupled to a top bank of sense amplifiers 802, while the other half of the bit lines pairs are coupled to a bottom bank of sense amplifiers 804.

Each sense amplifier bank (802a, 802b, 804a and 804b) is further logically subdivided into even sense sections 806 and odd sense sections 808. The even sense sections 806 are coupled to corresponding even bit line sections 810 of the memory cell array 800. In the same fashion, the odd sense sections 808 are coupled to corresponding odd bit line sections 812 in the memory cell array 800. In a read operation of the preferred embodiment, either the even sense sections 806 or the odd sense sections 808 will be activated. When activated, each sense section (806 or 808) will amplify the data signals on its respective even or odd bit line sections (810 or 812). To illustrate this sensing arrangement, FIG. 8 includes hatching within array 800a of array bank 702(0,0) to show the amplification of even bit line sections 810 during an "even" sense operation.

The amplified data on the bit lines sections (810 or 812) are coupled to local I/O lines by top Y-select circuits 814 and bottom Y-select circuits 816. Throughout the majority of the preferred embodiment reduced page size RAM 500, the Y-select circuits are shared. Thus, except for the top Y-select circuits of bank 704(0) and the bottom Y-select circuits of bank 704(15), the bottom Y-select circuit of one array bank will also function as the top Y-select circuit of the array bank below. For example, as shown in FIG. 8, the bottom Y-select circuit 816a for array bank 702(0,0) is also a top Y-select circuit 814b for array bank 702(1,0).

The Y-select circuits (814 and 816) couple selected bit lines pairs to I/O lines according to Y-select signals received from an associated column decoder block (710a–710d). Because the two array blocks (702(0,0) and 702(1,0)) are in quadrant 706a, the Y-select circuits (814 and 816) of FIG. 8 would receive Y-select signals from column decoder block 710a. Conductors which provide the Y-select signals may, as just one example, be generally aligned with the vertical borders separating even bit lines sections 810 from odd bit line sections 812.

Unlike the prior art reduced page size RAM of FIG. 5, the preferred embodiment provides a reduced page size, while maintaining a 128 bit I/O space, without a significant increase in die size. This is accomplished by the alternating activation of sense blocks, as illustrated in FIGS. 7 and 8, in conjunction with a unique I/O line arrangement illustrated in FIG. 9.

Figure 9:
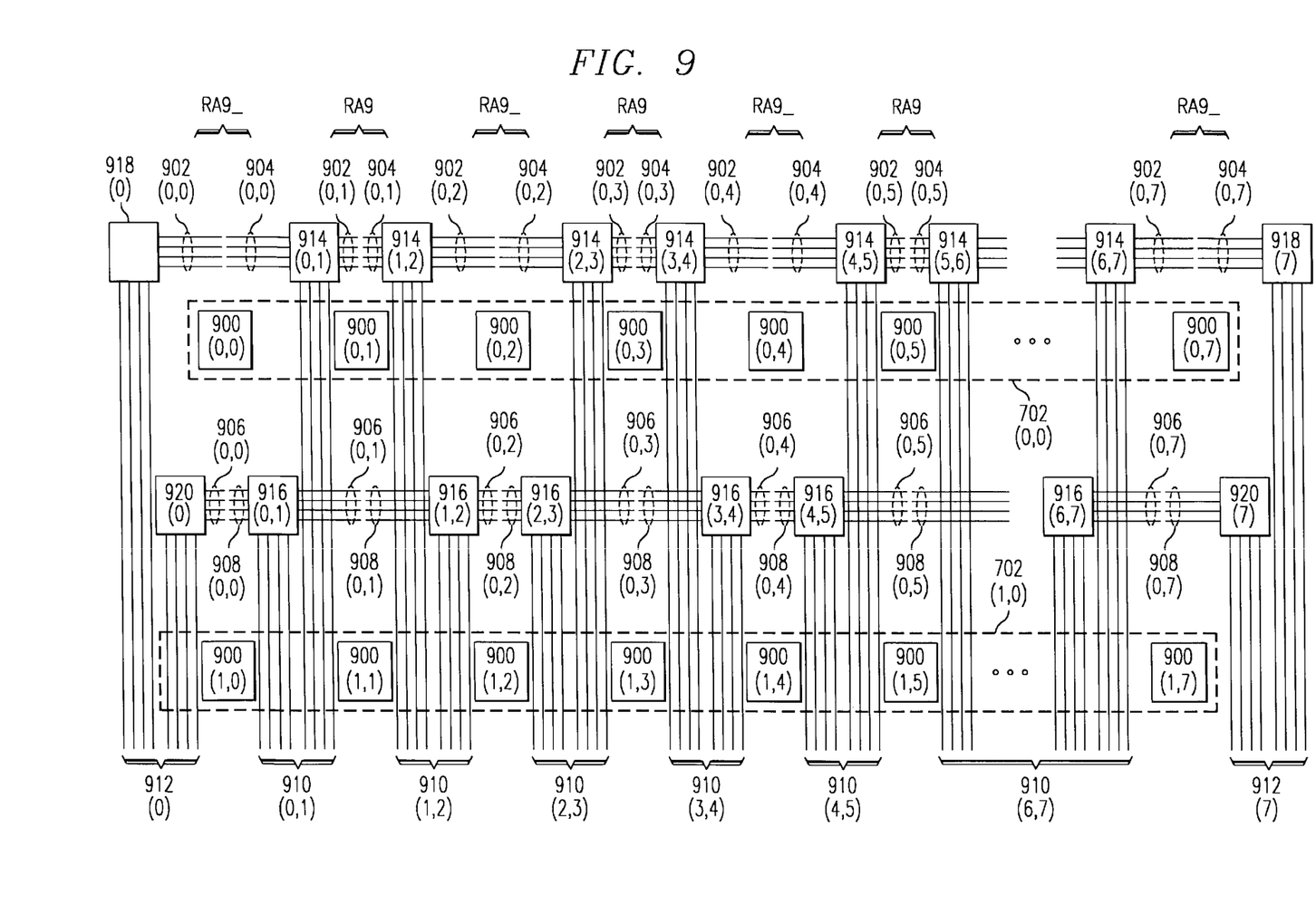
FIG. 9 is a block diagram illustrating the I/O arrangement according to the preferred embodiment.

FIG. 9 illustrates the I/O line arrangement for array blocks (702(0,0) and 702(1,0)). These two array blocks (702(0,0) and 702(1,0)) represent essentially one eighth of memory quadrant 706a. In FIG. 9, each array bank (702(0,0) and 702(1,0)) is shown to be logically divided into eight array sections, represented by reference characters 900($i,j$), where i represents the bank in which array section is located, and j represents the position of the array section within the array block (702(0,0) and 702(1,0)). If reference is made to FIG. 9 in conjunction with FIG. 8, it is noted that array sections 900(0,0), 900(0,2), 900(0,4), 900(0,6) could be conceptualized as being "even" array sections. Each even array section includes one even sense section 806 from both the top and bottom sense amplifier banks (802 and 804) coupled to one even bit line section 810. It follows that array sections 900(0,1), 900(0,3). 900(0,5), 900(0,7) could be considered "odd" array sections, as each includes one odd bit line section 812 coupled to one of the odd sense sections 808 from both the top and bottom sense amplifier banks (802 and 804).

In addition to the sense sections (806 or 808) and bit line sections (810 or 812), each array section (900(0,0) to 900(1,7)) further includes one eighth of the associated top Y-select circuit (814) and bottom Y-select circuit (816).

In the I/O line arrangement of FIG. 9, each array section (900(0,0) to 900(1,7)) includes two top left pairs of local I/O (LIO) lines 902($k,l$), two top right pairs of LIO lines 904($k,l$), two bottom left pairs of local LIO lines 906($k,l$), and two bottom right pairs of LIO lines 908($k,l$). The variables k and l identify which array section the LIO line pairs are coupled to.

The LIO line pairs are coupled to Y-select outputs (also referred to as "I/Os") of their respective array sections. However, unlike the prior art I/O arrangements illustrated in FIGS. 3 and 6, the LIO line pairs of the preferred embodiment are not uniformly coupled to all the Y-select outputs of their respective array sections. Instead, in the preferred embodiment, the Y-select outputs of each array section can be conceptualized as being arranged into sets of Y-select outputs (or groups of I/Os), with one set being coupled to the upper left LIO line pairs, a second set being coupled to the upper right LIO line pairs, a third set being coupled to the lower left LIO line pairs, and a fourth set being coupled to the lower right LIO line pairs.

The LIO line pairs (902, 904, 906 and 908) are further coupled to global I/O (GIO) line pairs by I/O select blocks. The GIO line pairs include shared GIO line pairs, designated by the reference character 910($l,l$+1), and "edge" GIO line pairs, designated by the reference character 912($l$). The letter l indicates which vertical group of array sections (900(0,0) to 900(1,7)) the GIO pair is coupled to. For example, in FIG. 9 four shared GIO line pairs are identified by the reference character 910(1,2). This indicates the GIO line pairs are coupled to the vertical array section group which includes array sections 900(0,1), 900(0,2), and the vertical group of array sections which includes array sections 900(1,1), 900 (1,2). The end GIO line pairs are only coupled to one vertical set of array sections. Thus in FIG. 9, 36 pairs of GIO lines are illustrated, 28 pairs being shared between even and odd array sections, 4 pairs being coupled to only even array sections, and another 4 pairs being coupled to only odd array sections. This represents an increase of only 4 pairs of "edge" GIO lines over the prior art large page size RAM of FIG. 3, and no increases in the amount of area for the LIO lines. In this manner, a large I/O space is retained without a significant increase in die size.

The sharing of GIO line pairs between even and odd array sections is accomplished with shared upper I/O select blocks 914($l,l$+1), shared lower I/O select blocks 916($l,l$+1), edge upper I/O select blocks 918($l$), and edge lower I/O select blocks 920($l$). The letters l indicate the same array section association described in conjunction with the GIO lines. For example, upper shared I/O select block 914(0,1) couples upper LIO line pairs 904(0,0) and 902(0,1) to GIO line pairs 910(0,1). In contrast, edge upper I/O select block 918(0) couples only upper LIO lines pair 902(0,0) to edge GIO pairs 912(0).

The shared I/O select blocks (914 and 916) may operate in a variety ways. For example, when enabled, I/O select block 914(0,1) may couple upper LIO lines 904(0,0) and 902(0,1) to GIO line pairs 910(0,1). In such a case, the upper/lower right LIO lines for one I/O select block, could be contiguous with the upper/lower right LIO lines of an adjacent I/O select block. This is possible because the sense amplifiers in the adjacent I/O select block will be disabled, and thus will not place data on their respective LIO line pairs. Alternatively, if it is desirable to reduce capacitance, I/O select block 914(0,1) could isolate LIO line pairs 904 (0,0) from LIO line pairs 902(0,1), while coupling LIO line pairs 904(0,0) to GIO line pairs 910(0,1).

An alternate way of conceptualizing the I/O select blocks (914, 916, 918 and 920) is to consider the I/O select blocks as being logically divided into first and second groups, each including every other I/O select block. For example, the first group could include I/O blocks 914(0,1), 914(2,3), 914(4,5), and 914(6,7), while the second group could include I/O blocks 914(1,2), 914(3,4), and 914(5,6). In an even sense mode, each I/O select block in the first groups serves to couple data on upper right LIO line pairs 904 to the GIO line pairs. In and odd sense mode, the I/O select blocks of the first group couple data on upper left LIO lines pairs 902 to the GIO line pairs. The I/O select blocks in the second group operate in the opposite fashion. In an even sense mode, each couples upper left LIO line pairs 902 to GIO lines. In an odd sense mode, upper right LIO pairs 904 are coupled to GIO lines. The other I/O select blocks may also be conceptualized as being arranged into two groups.

Referring again to FIG. 9, a row address indication is set forth above the even and odd array sections. The row address values are shown as RA9 and RA9_. The row address indication illustrates that when a low RA9 value is applied to the RAM 700, the sense amplifiers within the even array sections of a bank are activated (an even sense mode, or even sense operation). In contrast, when the RA9 value is high, the sense amplifiers within the odd banks are activated (an odd sense mode, or odd sense operation). It is noted that the I/O select blocks associated with a given array section (900(0,0) to 900(1,7)) are enabled when the sense amplifiers within the array section are activated.

For example, assume that bank 702(0,0) is selected, and the RA9 value is low. This condition would result in the activation of the sense amplifiers within array sections 900(0,0), 900(0,2), 900(0,4) and 900(0,6). Taking array section 900(0,0) first, when the sense amplifiers within are activated, edge I/O select blocks 918(0) and 920(0) are enabled, coupling GIO line pairs 912(0) to the array section 900(0,0). In addition, I/O select blocks 914(0,1) and 916(0, 1) are also enabled, coupling GIO lines pairs 910(0,1) to the array section 900(0,0). With the RA9 value low, the sense amplifiers within array section 900(0,1) are not active, therefore, no data is placed on LIO line pairs 902(0,1) and 904(0,1). However, the sense amplifiers within array section 900(0,2) are activated, therefore, I/O select blocks 914(1,2), 914(2,3), 916(1,2) and 916(2,3) are enabled. This places data on GIO line pairs 910(1,2) and 910(2,3). It follows that when the sense amplifiers within array section 900(0,4) are activated, data will placed in GIO line pairs 910(3,4) and 910(4,5). Further, when the sense amplifiers within array section 900(0,6) are activated, data will be placed on GIO line pairs 910(5,6) and 910(6,7). No data will be placed on edge GIO line pairs 912(7).

In contrast, if it is assumed that bank 702(0,0) is selected and the RA9 value is high, the sense amplifiers within the odd array sections (900(0,1), 900(0,3), 900(0,5), 900(0,7)) will be activated. With the activation of the sense amplifiers within array section 900(0,1), I/O select blocks 914(0,1), 914(1,2), 916(0,1) and 916(1,2) will be enabled. The activation of the sense amplifiers within array section 900(0,3), results in the enabling of I/O select blocks 914(2,3), 914(3, 4), 916(2,3) and 916(3,4). The activation of the sense amplifiers within array section 900(0.5) enables I/O select blocks 914(4,5), 914(5,6), 916(4,5) and 916(5,6). Finally, the activation of the sense amplifiers in array section 900 (0,7) enables I/O select block 914(6,7) and 916(6,7) and edge I/O select blocks 918(7) and 920(7). When RA9 is high, edge I/O select blocks 918(0) and 920(0) remain disabled.

It is noted that in an even sense action (i.e., RA9 low), within each even array section of a selected bank, a word line (or set of word lines) will be activated. At the same time, all of the word lines within the odd array sections of the selected bank will be inactive. Conversely, in an odd sense action (RA9 high), a word line (or set of word lines) within the odd array sections will be activated, while the word lines within the even array sections will be disabled. For example, referring once again to FIG. 9, assuming that bank 702(0,0) is selected, and RA9 is low, a word line (or word lines) within array sections 900(0,0), 900(0,2), 900(0,4) and 900

(0,6) will be active, while the word lines within array sections 900(0,1), 900(0,3), 900(0,5) and 900(0,7) will be inactive.

One way in which to accomplish the alternating activation of word lines is through the use of "segmented" word lines, each coupled to a "global" word line by a decoded device. Thus, the memory cells in each array section 900 would be connected to segmented word lines, with the segmented word line of the same row in each array section being coupled to a corresponding global word line by a decode transistor. In the particular embodiment of FIG. 9, the decode transistors could be activated according to the RA9 value. For example, if the first bank 702(0,0) is selected and RA9 is low, a global word line that spans all of the array sections (900(0,0) to 900(0,7))) would be activated. At the same time, because the RA9 value is low, decode transistors in the even array sections (900(0,0), 900(0,2), 900(0,4) and 900(0,6))) would couple the activated global word line to one or more of their respective segmented word lines. In addition, the decode transistors in the odd array sections would be turned off, isolating the segmented word lines within each of the odd array sections (900(0,1), 900(0,3), 900(0,5) and 900(0,7))) from the activated global word line.

If reference is made back to FIG. 7 in conjunction with FIG. 9, it is noted that the I/O arrangement illustrated in FIG. 9 is repeated throughout the RAM 700. It is also noted that in the preferred embodiment, the array blocks within quadrants 706b and 706c vary from those in quadrants 706a and 706d. In particular, because the array blocks of quadrant 706b are connected to array blocks of quadrant 706c, the array blocks of quadrant 706b will not include edge I/O select blocks 918(7) and 920(7), and the array blocks of quadrant 706c will not include edge I/O select blocks 918(0) and 920(0). Instead, the adjacent array blocks share I/O select blocks.

Figure 10A:
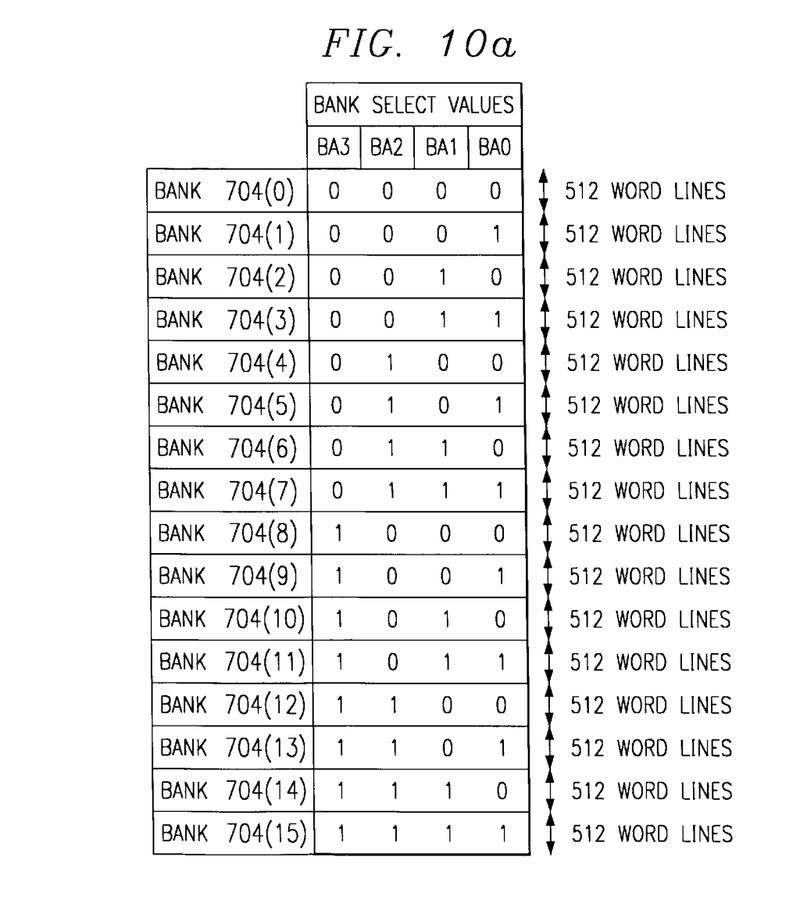
FIG. 10a is a table illustrating the bank and row decoding arrangement of the preferred embodiment.
Figure 10B:
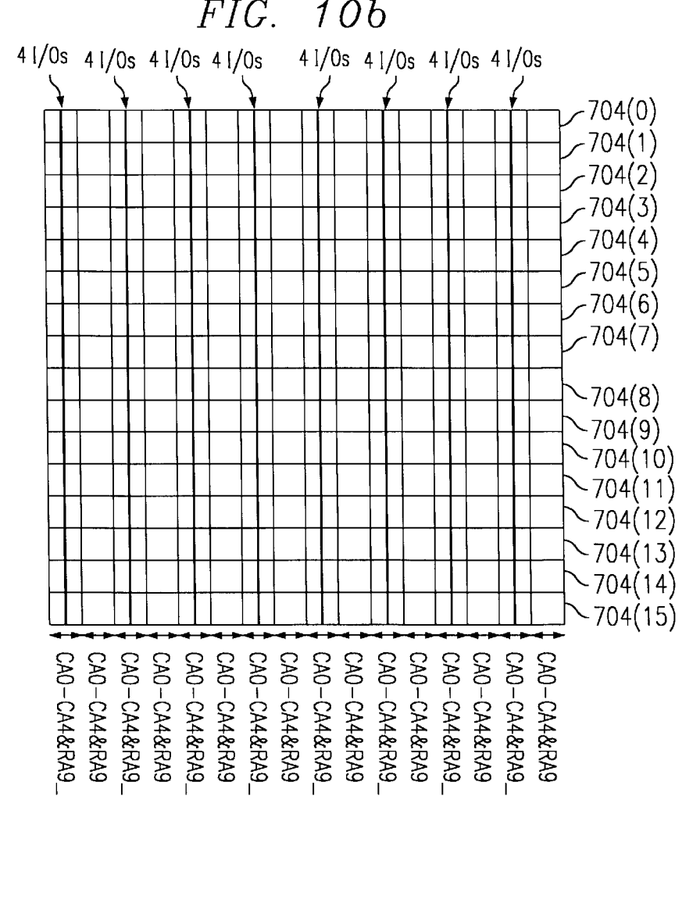
FIG. 10b illustrates the column decoding arrangement of the preferred embodiment.

As noted above, data locations within the reduced page size RAM 700 are accessed by selecting one of the banks (704(0) to 704(15)), and applying a column address and a row address. The decoding arrangement of the preferred embodiment is illustrated in FIGS. 10a and 10b. FIG. 10a is a table setting forth the bank select decoding scheme and a portion of the row decoding scheme. The RAM 700 receives bank select decode information in the form of four bank select bits, shown as BA0–BA3. The banks (704(0) to 704(15)) are selected according to the various combinations shown. The 512 rows within each bank, are selected by a row address, nine bits of which are shown as RA0–RA8. In addition, it is recalled that a tenth address bit RA9 is used to enable either the even or the odd sense sections (806 or 808) within each array block (702(0,0) to 702(15,3)).

The address bit RA9 is also used in the selection of columns within the RAM 700. Referring now to FIG. 10b, a block diagram is set forth showing the column decoding arrangement for quadrant 706a of the RAM 700. The 2k columns of the quadrant 706a are logically divided into 16 groups of 128 columns each. Four columns are selected from the 128 columns of each group, by the application of column address bits, shown as CA0–CA4, and the row address RA9. In this manner, the application of the column address information (CA0–C4) and row address bit RA9, selects 32 columns in each quadrant (706a–706d) to provide a 128 bits I/O space, while at the same time reducing power consumption by activating only half of the sense amplifiers in the accessed bank.

Figure 11:
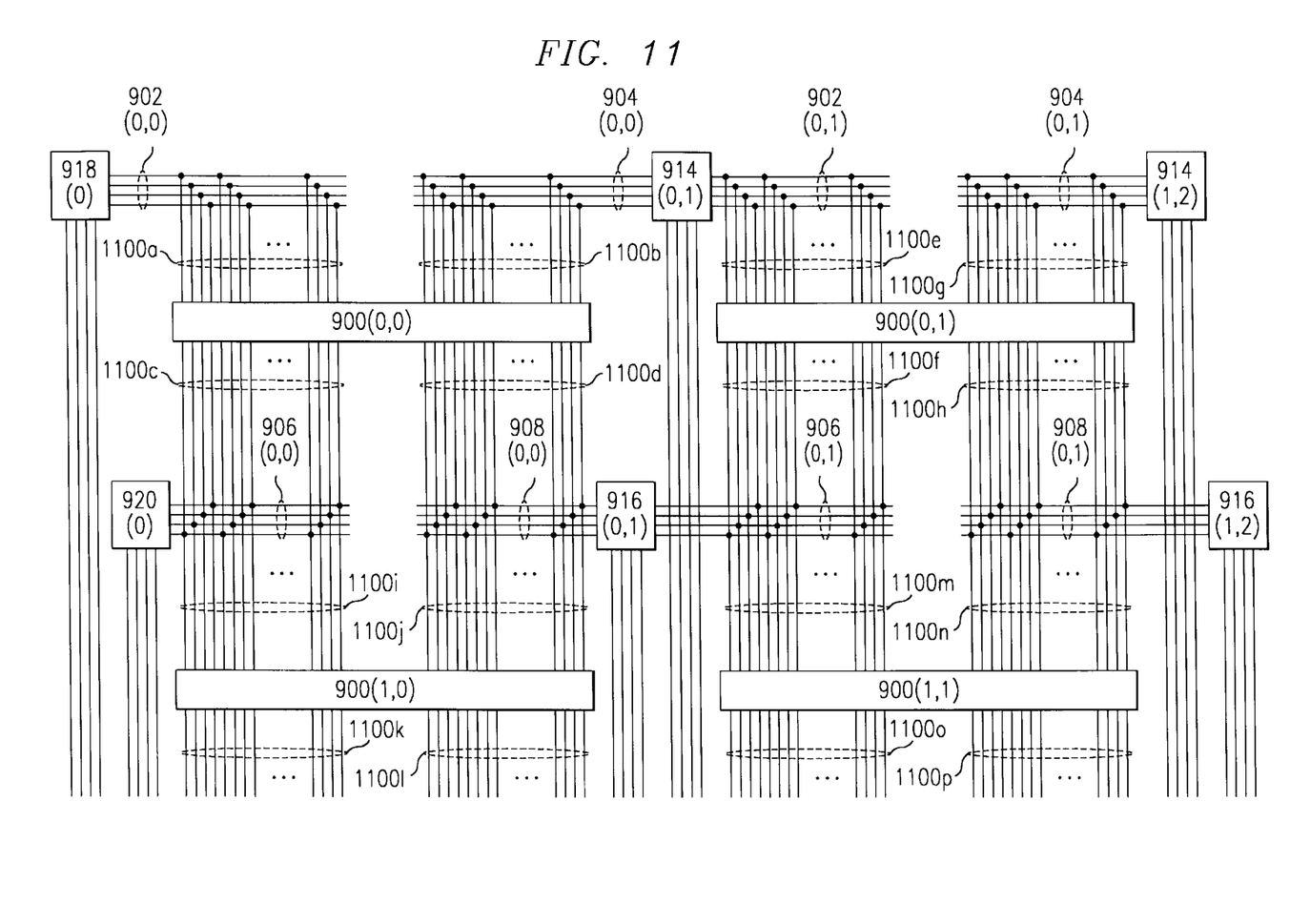
FIG. 11 is a detailed block diagram illustrating a portion of the I/O arrangement of FIG. 9.

Referring now to FIG. 11, a portion of the I/O arrangement of FIG. 9 is set forth in a block diagram to illustrate the LIO line connections to each array section in more detail. Structures set forth in FIG. 9 are repeated in FIG. 11, including even array sections 900(0,0) and 900(1,0), odd array sections 900(0,1) and 900(1,1), and the LIO line pairs and I/O select blocks associated therewith. Groups of Y-select outputs (or "I/Os") of each array section 900 are identified by the reference characters 1100a–1100p. Thus, array section 900(0,0) provides Y-select output groups 1100a–1100d, array section 900(0,1) provides Y-select output groups 1100e–1100h, array section 900(1,0) provides Y-select output groups 1100i–1100l, and array section 900(1,1) provides Y-select output groups 1100m–1100p. It is noted that LIO line pairs 906(0,0) are shared with Y-select output groups 1100c and 1100i, LIO line pairs 908(0,0) are shared with Y-select output groups 1100d and 1100j, LIO line pairs 906(0,1) are shared with Y-select output groups 1100f and 1100m, and LIO line pairs 908(0,1) are shared with Y-select output groups 1100h and 1100n.

Although the present invention has been described in detail, it should be understood that various changes, substitutions, and alterations could be made without departing from the spirit and scope of the invention as defined by the appended claims.

What is claimed is:

1. A random access memory (RAM), comprising:

a plurality of shared global input/output (GIO) lines, logically arranged into first GIO line groups and second GIO line groups;

a plurality of local I/O (LIO) lines arranged into first LIO line groups and second LIO line groups;

a plurality of first bank array sections, each having a first set of outputs coupled to one of the first LIO line groups, and a second set of outputs coupled to one of the second LIO line groups;

a plurality of input/output (I/O) select blocks, including first I/O select blocks, each coupled to a first GIO line group, and second I/O select blocks, each coupled to a second GIO line group, each first and second I/O select block being further coupled to a first and second LIO line group, the first I/O select blocks coupling their respective first LIO line group to their respective first GIO line group according to a first address value, and coupling their respective second LIO line group to their respective first GIO line group according to a second address value, and the second I/O select blocks coupling their respective second LIO line group to their respective second GIO line group according to the first address value, and coupling their respective first LIO line group to their respective second GIO line group according to the second address value.

2. The RAM of claim 1, wherein:

the first and second GIO line groups each include two pairs of GIO lines.

3. The RAM of claim 1, wherein:

each bank array section includes a plurality of bit lines; and the GIO lines are generally parallel to the bit lines.

4. The RAM of claim 1, wherein:

the first and second LIO line groups each include two pairs of LIO lines.

5. The RAM of claim 1, wherein:

each bank array section includes a plurality of word lines; and the LIO lines are generally parallel to the word lines.

6. The RAM of claim 1, wherein:

the plurality of bank array sections includes alternating even and odd array sections, each array section including a plurality of sense amplifiers arranged into a sense section, the sense sections of the odd array sections being activated according to the first address value, the sense sections of the even array sections being activated according to the second address value.

7. The RAM of claim 6, wherein:

the first I/O select blocks are coupled to the first LIO groups of odd array sections and the second LIO groups of even array sections, and the second I/O select blocks are coupled to the first LIO groups of even array sections and the second LIO groups of odd array sections.

8. The RAM of claim 1, wherein:

the GIO lines are further logically arranged into third GIO line groups and fourth GIO line groups;

the LIO lines are further arranged into third LIO line groups and fourth LIO lines groups;

each even bank array section further includes a third set of outputs coupled to one of the third LIO line groups, and a fourth set of outputs coupled to one of the fourth LIO line groups;

the I/O select blocks further include third I/O select blocks, each coupled to a third GIO line group, and fourth I/O select blocks, each coupled to a fourth GIO line group, each third and fourth I/O select block being further coupled to a third and fourth LIO line group, the third I/O select blocks coupling their respective third LIO line group to their respective third GIO line group according to the first address value, and coupling their respective fourth LIO line group to their respective third GIO line group according to the second address value, and the fourth I/O select blocks coupling their respective fourth LIO line group to their respective fourth GIO line group according to the first address value, and coupling their respective third LIO line group to their respective fourth GIO line group according to the second address value.

9. The RAM of claim 8, further including:

a plurality of second bank array sections, each having a first set of outputs coupled to one of the third LIO line groups, and a second set of outputs coupled to one of the fourth LIO line groups.

10. A random access memory (RAM) architecture, comprising:

at least one array block including a plurality of memory cells, a sense amplifier bank, and a Y-select circuit, the array block being logically divided into even array sections and odd array sections, each even array section having first and second sets of even Y-select outputs, each odd array section having first and second sets of odd Y-select outputs, the sense amplifiers within the even array sections being activated in an even sense operation, the sense amplifiers within the odd array sections being activated in an odd sense operation;

a plurality of first even local I/O line (LIO) sets, each first even LIO set being coupled to the first even Y-select outputs of the even array sections;

a plurality of second even LIO sets, each second even LIO set being coupled to the second even Y-select outputs of the even array sections;

a plurality of first odd LIO sets, each first odd LIO set being coupled to the first odd Y-select outputs of the odd array sections;

a plurality of second odd LIO sets, each second odd LIO set being coupled to the second odd Y-select outputs of the odd array sections;

a plurality of global I/O (GIO) lines;

a plurality of I/O select blocks coupled to the GIO lines, the I/O select blocks coupling the first and second even LIO line sets to the GIO lines in the even sense operation, and coupling the first and second odd sets of LIO lines to the GIO lines in the odd sense operation.

11. The RAM architecture of claim 10, wherein:

the even array sections include a plurality of bit lines logically arranged into even bit line sections, and the odd array sections include a plurality of bit lines logically arranged into odd bit line sections.

12. The RAM architecture of claim 11, wherein:

the even array sections each include an even Y-select circuit portion coupled to the even bit line section therein, each even Y-select portion receiving Y-select signals and coupling selected bit lines from its respective even bit line section to the first and second even Y-select outputs of the even array section, and the odd array sections each include an odd Y-select circuit portion coupled to the odd bit line section therein, each odd Y-select portion receiving Y-select signals and coupling selected bit lines from its respective odd bit line section to the first and second odd Y-select outputs of the odd array section.

13. The RAM architecture of claim 10, further including:

each even array section further includes third and fourth sets of even Y-select outputs, and each odd array section further includes third and fourth sets of odd Y-select outputs;

a plurality of third even LIO sets, each third even LIO set being coupled to the third even Y-select outputs of the even array sections;

a plurality of fourth even LIO sets, each fourth even LIO set being coupled to the fourth even Y-select outputs of the even array sections;

a plurality of third odd LIO sets, each third odd LIO set being coupled to the third odd Y-select outputs of the odd array sections;

a plurality of fourth odd LIO sets, each fourth odd LIO set being coupled to the fourth odd Y-select outputs of the odd array sections;

the plurality of I/O select blocks further couples the third and fourth even LIO line sets to the GIO lines in the even sense operation, and couples the third and fourth odd sets of LIO lines to the GIO lines in the odd sense operation.

14. The RAM architecture of claim 13, wherein:

the sense amplifier bank includes a upper sense amplifier bank and a lower sense amplifier bank, the Y-select circuit includes an upper Y-select circuit coupled to the upper sense amplifier bank and a lower Y-select circuit coupled to the lower sense amplifier bank, the upper Y-select circuit providing the first and second Y-select outputs for the even and odd array sections, the lower Y-select circuit providing the third and fourth Y-select outputs for the even and odd array sections.

15. The RAM architecture of claim 10, further including:

the at least one array block includes a plurality of array blocks forming at least one quadrant, the Y-select circuits within the array blocks of the quadrant commonly receiving Y-select signals from a column decoder block.

16. The RAM architecture of claim 15, further including:

the plurality of array blocks forms a plurality of quadrants, the Y-select circuits within the array blocks of each quadrant commonly receiving Y-select signals from a column decoder block particular to the quadrant.

17. A random access memory (RAM) input/output (I/O) scheme, comprising:

a first bank logically divided into a plurality of array sections, each array section including a plurality of storage locations accessed via a first I/O group and a second I/O group;

a second bank logically divided into a plurality of array sections, each array section including a plurality of storage locations accessed via a first I/O group and a second I/O group;

a plurality of first local I/O (LIO) line sets shared with the first I/O group of each array section in the first bank and the first I/O group of a corresponding array section in the second bank;

a plurality of second local LIO line sets shared with the second I/O group of each array section in the first bank and the second I/O group of a corresponding array section in the second bank, and a plurality of I/O select blocks, each I/O select block coupling a second LIO line set of an array section and the first LIO line set of an adjacent array section, to a set of global I/O lines.

18. The RAM I/O scheme of claim 17, wherein:

the first bank includes even array sections adjacent to odd array sections;

the second bank includes even array sections adjacent to odd array sections;

the first LIO line sets are shared with first I/O groups of even array sections in the first bank and first I/O groups of corresponding even array sections in the second bank, and also shared with first I/O groups of odd array sections in the first bank and corresponding first I/O groups of odd array sections in the second bank;

the second LIO line sets are shared with second I/O groups of even array sections in the first bank and second I/O groups of corresponding even array sections in the second bank, and also shared with second I/O groups of odd array sections in the first bank and corresponding second I/O groups of odd array sections in the second bank; and each I/O select block couples the first and second LIO sets of even array sections to the global I/O lines in an even sense cycle, and couples the first and second LIO sets of odd array sections to the global I/O lines in an odd sense cycle.

19. The RAM I/O scheme of claim 18, wherein:

the even array sections of the first and second banks each include sense amplifiers arranged into an even sense section, and the odd array sections of the first and second bank each include sense amplifiers arranged into an odd sense section, the even sense sections being activated in an even sense cycle the odd sense sections being activated in an odd sense cycle.

20. The RAM I/O scheme of claim 17, wherein:

each I/O select block couples its respective second LIO line set to its respective global I/O lines in one sense mode, and couples its respective first LIO line set to its respective global I/O lines in another sense mode.

21. The RAM I/O scheme of claim 20, wherein:

the array sections of the first and second banks include even array sections, each including sense amplifiers arranged into even sense sections, and odd array sections, each including sense amplifiers arranged into odd sense sections, the even sense sections being activated in an even sense cycle the odd sense sections being activated in an odd sense cycle; and the I/O select blocks are logically arranged into first I/O select blocks and second I/O select blocks, each first I/O select block coupling its respective second LIO line set to its respective global I/O lines in an even sense mode, and coupling its respective first LIO line set to its respective global I/O lines in an odd sense mode, each second I/O select block coupling its respective first LIO line set to its respective global I/O lines in an even sense mode, and coupling its respective second LIO line set to its respective global I/O lines in an odd sense mode.

22. The RAM I/O scheme of claim 20, wherein:

each I/O select block couples its respective second LIO line set and its respective first LIO line set to its respective global I/O lines simultaneously.

23. The RAM I/O scheme of claim 22, wherein:

the array sections of the first and second banks include even array sections, each including sense amplifiers arranged into even sense sections, and odd array sections, each including sense amplifiers arranged into odd sense sections, the odd sense sections being disabled in an even sense cycle the even sense sections being disabled in an odd sense cycle.

* * * * *